US008829495B2

(12) United States Patent
Kim et al.

(10) Patent No.: US 8,829,495 B2
(45) Date of Patent: Sep. 9, 2014

(54) ORGANIC LIGHT-EMITTING DISPLAY DEVICE AND METHOD OF MANUFACTURING THE SAME (75) Inventors: Eun-Ah Kim, Yongin (KR); Won-Kyu Kwak, Yongin (KR); Tae-Kyu Kim, Yongin (KR); Young-Hee An, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 265 days.

(21) Appl. No.: 13/035,780

(22) Filed: Feb. 25, 2011

(65) Prior Publication Data
US 2011/0297942 A1 Dec. 8, 2011

(30) Foreign Application Priority Data
Jun. 3, 2010 (KR) .................... 10-2010-0052368

(51) Int. Cl.
*H01L 29/74* (2006.01)
*H01L 27/32* (2006.01)
*H01L 51/52* (2006.01)
(52) U.S. Cl.
CPC ........ *H01L 27/3276* (2013.01); *H01L 51/5281* (2013.01); *H01L 51/524* (2013.01)
USPC ............................................. 257/40; 257/59
(58) Field of Classification Search
USPC ...................................... 257/40, 59
See application file for complete search history.

(56) References Cited

U.S. PATENT DOCUMENTS

| | | | | |
|---|---|---|---|---|
| 5,627,364 A * | 5/1997 | Codama et al. | ............ | 250/208.1 |
| 6,433,487 B1 * | 8/2002 | Yamazaki | .................. | 315/169.3 |
| 6,787,796 B2 * | 9/2004 | Do et al. | ......................... | 257/40 |
| 7,005,671 B2 * | 2/2006 | Yamazaki et al. | .............. | 257/40 |
| 7,508,004 B2 * | 3/2009 | Ishiguro | .......................... | 257/88 |
| 7,821,198 B2 * | 10/2010 | Kim et al. | ..................... | 313/505 |
| 7,903,055 B2 * | 3/2011 | Nishikawa et al. | ............. | 345/77 |
| 8,323,065 B2 * | 12/2012 | Kwon et al. | .................... | 445/25 |
| 8,357,961 B2 * | 1/2013 | Hanari | ......................... | 257/294 |

FOREIGN PATENT DOCUMENTS

| | | |
|---|---|---|
| KR | 1020010093634 A | 10/2001 |
| KR | 1020070072320 A | 7/2007 |
| KR | 1020090013857 A | 2/2009 |

* cited by examiner

*Primary Examiner* — Eugene Lee
(74) *Attorney, Agent, or Firm* — Knobbe Martens Olson & Bear LLP (57) ABSTRACT

An organic light-emitting display device and a method of manufacturing the same are disclosed. The organic light-emitting display device includes: a lower substrate including a display area and a non-display area, the lower substrate further including a power supply wiring unit disposed in the non-display area, the power supply wiring unit including at least one power supply wiring extending along an edge of the display area; an encapsulation substrate having an outer surface and an inner surface facing the lower substrate; a cavity formed into the inner surface of the encapsulation substrate in a region over the power supply wiring unit such that the cavity overlaps at least part of the power supply wiring when viewed in a direction perpendicular to the outer surface of the encapsulation substrate; and a polarizing plate disposed on the outer surface of the encapsulation substrate.

24 Claims, 6 Drawing Sheets

ORGANIC LIGHT-EMITTING DISPLAY DEVICE AND METHOD OF MANUFACTURING THE SAME

CROSS-REFERENCE TO RELATED APPLICATIONS

This application claims the benefit of Korean Patent Application No. 10-2010-0052368, filed on Jun. 3, 2010, in the Korean Intellectual Property Office, the disclosure of which is incorporated herein in its entirety by reference.

BACKGROUND

1. Field

The present disclosure relates to an organic light-emitting display device and a method of manufacturing the same.

2. Description of the Related Technology

Generally, an organic light-emitting display device is a self light-emitting device with wide viewing angles and excellent contrast. The weight and thickness of the organic light-emitting display device can generally be reduced since the organic light-emitting display device does not require a backlight unit. The organic light-emitting display device is also advantageous in terms of power consumption.

Organic light-emitting display devices generally include a lower substrate on which a display unit for displaying an image is disposed, and an encapsulation substrate bonded to the lower substrate with a sealing element.

The display unit includes a plurality of sub-pixels that are formed in a region where a plurality of data lines and a plurality of gate lines cross one another. Outside the display unit, a driving wiring unit for transmitting driving signals to the plurality of data lines and the plurality of gate lines, and a power supply wiring unit for transmitting power supply voltages to the data lines and the gate lines are disposed.

When the lower substrate and the encapsulation substrate contact each other, a short circuit may occur, and appearance defects may occur.

SUMMARY OF CERTAIN INVENTIVE ASPECTS

The present disclosure provides an organic light-emitting display device that prevents appearance defects caused by the decolorization of a polarizing plate.

According to an aspect, there is provided an organic light-emitting display device including: a lower substrate including a power supply wiring unit disposed in a non-display area that is outside of a display area in which an image is displayed; an encapsulation substrate having a cavity formed in a region corresponding to the power supply wiring unit; and a polarizing plate disposed on the encapsulation substrate.

The power supply wiring unit may include: a first power supply wiring for transmitting a first power supply voltage; and a second power supply wiring for transmitting a second power supply voltage.

The first power supply wiring may be disposed more adjacent to the display area than the second power supply wiring.

The cavity may be formed in a region corresponding to the first power supply wiring.

A plurality of thin film transistors (TFTs) may be disposed on the display area, and each of the TFTs may include: an active layer; a gate electrode disposed on a gate insulating layer that covers the active layer and extends to the non-display area; and source and drain electrodes disposed on an interlayer insulating layer that covers the gate electrode and extends to the non-display area and contacts the active layer through a contact hole formed in the gate insulating layer and the interlayer insulating layer, and the first power supply wiring and the second power supply wiring may be separated from each other on the interlayer insulating layer disposed in the non-display area.

The first power supply wiring and the second power supply wiring may include the same material as the material used to form the source and drain electrodes.

The organic light-emitting display device may further include: a planarization layer covering the source and drain electrodes and extending to the non-display area; a first conductive layer patterned on the planarization layer in the display area in each of sub-pixels and disposed on the planarization layer in the non-display area without being patterned; a pixel defining layer covering the planarization layer and exposing portions of the first conductive layer; and a second conductive layer disposed on the first conductive layer when an organic layer is disposed between the first electrode and the second electrode in the display area, and contacts the first conductive layer in the non-display area.

Portions of the second power supply wiring may contact portions of the first conductive layer.

A height of the cavity may be equal to or less than a half of a height of the encapsulation substrate.

The organic light-emitting display device may further include a sealing element surrounding the display area and the power supply wiring unit and bonding the lower substrate and the encapsulation substrate together.

According to another aspect, there is provided a method of manufacturing an organic light-emitting display device, the method including: forming a lower substrate divided into a display area in which an image is displayed, and a non-display area that is outside of the display area, the lower substrate including a power supply wiring unit disposed in the non-display area; forming an encapsulation substrate having a cavity formed in a region corresponding to the power supply wiring unit; and forming a polarizing plate on the encapsulation substrate.

One aspect is an organic light-emitting display device including: a lower substrate including a display area and a non-display area, the lower substrate further including a power supply wiring unit disposed in the non-display area, the power supply wiring unit including at least one power supply wiring extending along an edge of the display area, an encapsulation substrate having an outer surface and an inner surface facing the lower substrate, a cavity formed into the inner surface of the encapsulation substrate in a region over the power supply wiring unit such that the cavity overlaps at least part of the power supply wiring when viewed in a direction perpendicular to the outer surface of the encapsulation substrate, and a polarizing plate disposed on the outer surface of the encapsulation substrate.

The at least one power supply wiring may include: a first power supply wiring configured to transmit a first power supply voltage, and a second power supply wiring configured to transmit a second power supply voltage.

The first power supply wiring may be disposed closer to the display area than the second power supply wiring.

The cavity may be formed in a region over the first power supply wiring.

A plurality of thin film transistors (TFTs) may be disposed on the display area, and each of the TFTs may include: an active layer, a gate electrode disposed on a gate insulating layer, where the gate insulating layer covers the active layer and extends to the non-display area, and source and drain electrodes disposed on an interlayer insulating layer, where the interlayer insulating layer covers the gate electrode and extends to the non-display area and contacts the active layer through a contact hole formed in the gate insulating layer and the interlayer insulating layer, and where the lower substrate includes an extension of the interlayer insulating layer from the display area, where the interlayer insulating layer is interposed between the first power supply wiring and the second power supply wiring.

The first power supply wiring and the second power supply wiring may include the same material as the material used to form the source and drain electrodes.

The organic light-emitting display device may further include: a planarization layer covering the source and drain electrodes and extending into the non-display area, a first conductive layer patterned on the planarization layer in the display area in each of sub-pixels and disposed on the planarization layer of the non-display area, a pixel defining layer covering the planarization layer and exposing portions of the first conductive layer, and a second conductive layer disposed on the first conductive layer and contacting the first conductive layer in the non-display area.

At least a portion of the second power supply wiring may contact at least a portion of the first conductive layer.

A height of the cavity may be equal to or less than a half of a height of the encapsulation substrate.

The organic light-emitting display device may further include a sealing element surrounding the display area and the power supply wiring unit and bonding the lower substrate and the encapsulation substrate together.

Another aspect is a method of manufacturing an organic light-emitting display device, the method including: providing a lower substrate including a display area and a non-display area outside of the display area, the lower substrate further including a power supply wiring unit disposed in the non-display area, the power supply wiring unit including at least one power supply wiring extending along an edge of the display area, providing an encapsulation substrate having an inner surface and an outer surface, where the inner surface faces the lower substrate, where a polarization plate is provided on the outer surface, where a cavity is formed into the inner surface, and aligning and bonding the lower substrate and the encapsulation substrate such that the cavity overlaps at least part of the power supply wiring when viewed in a direction perpendicular to the outer surface of the encapsulation substrate.

The at least one power supply wiring may include: a first power supply wiring configured to transmit a first power supply voltage, and a second power supply wiring configured to transmit a second power supply voltage.

The first power supply wiring may be disposed closer to the display area than the second power supply wiring.

The cavity may be formed in a region over the first power supply wiring.

A plurality of thin film transistors (TFTs) may be disposed in the display area, and each of the TFTs may include: an active layer, a gate electrode disposed on a gate insulating layer, where the gate insulating layer covers the active layer and extends to the non-display area, and source and drain electrodes disposed on an interlayer insulating layer, where the interlayer insulating layer covers the gate electrode and extends to the non-display area and contacts the active layer through a contact hole formed in the gate insulating layer and the interlayer insulating layer, and where the lower substrate includes an extension of the interlayer insulating layer from the display area, where the interlayer insulating layer is interposed between the first power supply wiring and the second power supply wiring.

The first power supply wiring and the second power supply wiring may include the same material as the material used to form the source and drain electrodes.

The method may further include: providing a planarization layer covering the source and drain electrodes and extending into the non-display area, providing a first conductive layer patterned on the planarization layer in the display area in each of sub-pixels and disposed on the planarization layer of the non-display area, providing a pixel defining layer covering the planarization layer and exposing portions of the first conductive layer, and providing a second conductive layer disposed on the first conductive layer contacting the first conductive layer in the non-display area.

At least a portion of the second power supply wiring may contact at least a portion of the first conductive layer.

A height of the cavity may be equal to or less than a half of a height of the encapsulation substrate.

The method of claim may further include forming a sealing element that surrounds the display area and the power supply wiring unit and bonds the lower substrate and the encapsulation substrate together.

BRIEF DESCRIPTION OF THE DRAWINGS

The above and other features and advantages will become more apparent by describing in detail exemplary embodiments with reference to the attached drawings in which.

DETAILED DESCRIPTION OF CERTAIN INVENTIVE EMBODIMENTS

The present disclosure provides embodiments of an organic light-emitting display device that prevents appearance defects caused by the decolorization of a polarizing plate.

Hereinafter, exemplary embodiments will be described more fully with reference to the accompanying drawings. Like reference numerals in the drawings generally denote like elements. In the following description, a detailed description of disclosed functions or structures will not be provided if they are deemed unnecessary and/or make features of the embodiments obscure. In the drawings, the thicknesses or sizes of layers or regions may be exaggerated for clarity. It will be understood that, unless otherwise specified, when an element such as a layer, film, region or substrate is referred to as being "on" another element, it can be "directly" on the other element or intervening elements may also be present.

Figure 1:
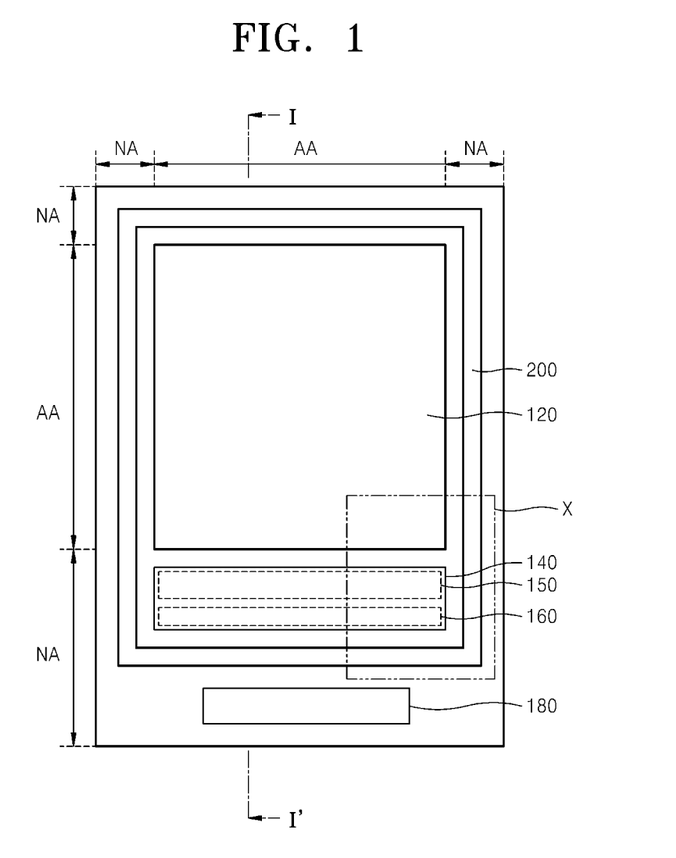
FIG. 1 is a schematic plan view of an embodiment of an organic light-emitting display device.
Figure 2:
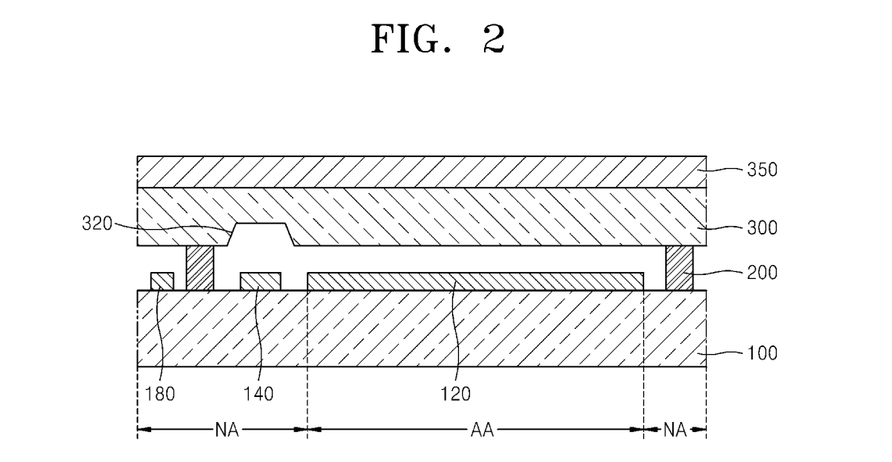
FIG. 2 is a cross-sectional view taken along line I-I' of FIG. 1.

FIG. 1 is a schematic plan view of an embodiment of an organic light-emitting display device. FIG. 2 is a cross-sectional view taken along line I-I' of FIG. 1, and FIG. 3 is an enlarged plan view of an area X of FIG. 1.

Figure 3:
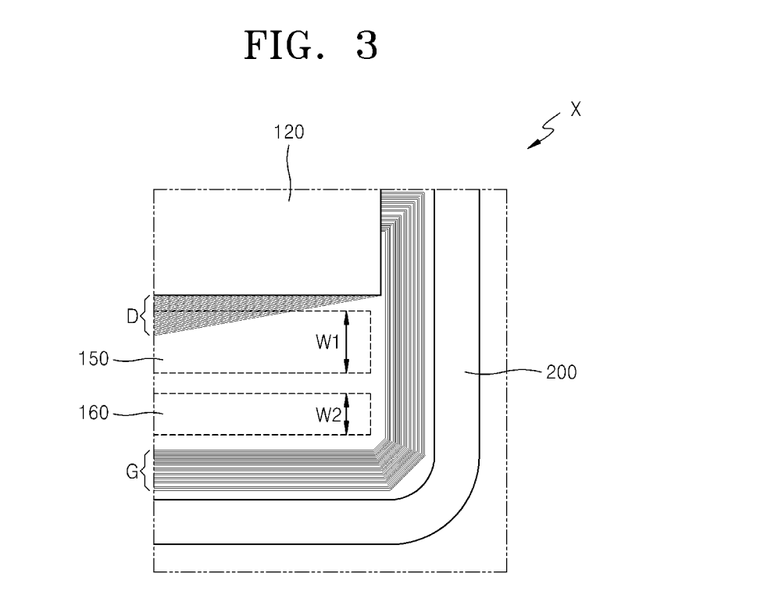
FIG. 3 is an enlarged plan view of an area X of FIG. 1.

Referring to FIGS. 1 through 3, an embodiment of the organic light-emitting display device includes a lower substrate 100, an encapsulation substrate 300, and a sealing element 200 that bonds the lower substrate 100 and the encapsulation substrate 300 together. A polarizing plate 350 is disposed on the encapsulation substrate 300. The lower substrate 100 includes a display area AA and a non-display area NA that surrounds the display area AA.

A display unit 120 for displaying an image is disposed on the display area AA.

Pixels (not shown) are defined in the display unit 120. The pixels are formed in a region where a plurality of gate lines (not shown) to which scan signals are applied in one direction and a plurality of data lines (not shown) which cross the plurality of gate lines perpendicular thereto and to which data signals are applied, cross one another. A power supply wiring unit 140, a driver integrated circuit (IC) 180, and the sealing element 200 are disposed on the non-display area NA.

The power supply wiring unit 140 may include a first power supply wiring 150 for transmitting a first power supply voltage VDD to the display unit 120, and a second power supply wiring 160 for transmitting a second power supply voltage VSS to the display unit 120. In some embodiments, the first power supply voltage VDD may be higher than the second power supply voltage VSS. The first power supply wiring 150 and the second power supply wiring 160 may be separated from each other by a predetermined distance. The first power supply wiring 150 may be disposed adjacent to the display unit 120 and have a width W1. The second power supply wiring 160 may be disposed adjacent to the sealing element 200 and have a width W2. In some embodiments, the width W1 of the first power supply wiring 150 may be larger than the width W2 of the second power supply wiring 160.

The driver IC 180 may be disposed outside the sealing element 200. The driver IC 180 may be connected to a gate wiring unit G and a data wiring unit D for transmitting driving signals to the plurality of gate lines and the plurality of data lines, respectively.

The sealing element 200 may surround the display unit 120 and the power supply wiring unit 140. The sealing element 200 may be formed by dissipating heat or irradiating ultraviolet (UV) rays onto a sealant to cure the sealant. In some embodiments, the sealant may be formed of a UV curing or heat curing material, such as silicon resin, epoxy-based resin, acryl-based resin, polyimide-based resin, or the like. In other embodiments, the sealant may be formed of other materials.

The encapsulation substrate 300 faces the lower substrate 100 and is sealed to the lower substrate 100. The encapsulation substrate 300 includes a cavity 320 formed in a region corresponding to the power supply wiring unit 140 disposed on the lower substrate 100. In some embodiments, the cavity 320 may be formed in a region corresponding to the first power supply wiring 150.

In the embodiment of FIG. 2, the polarizing plate 350 is disposed on the encapsulation substrate 300. The polarizing plate 350 helps prevent reflection of external light.

Figure 6A:
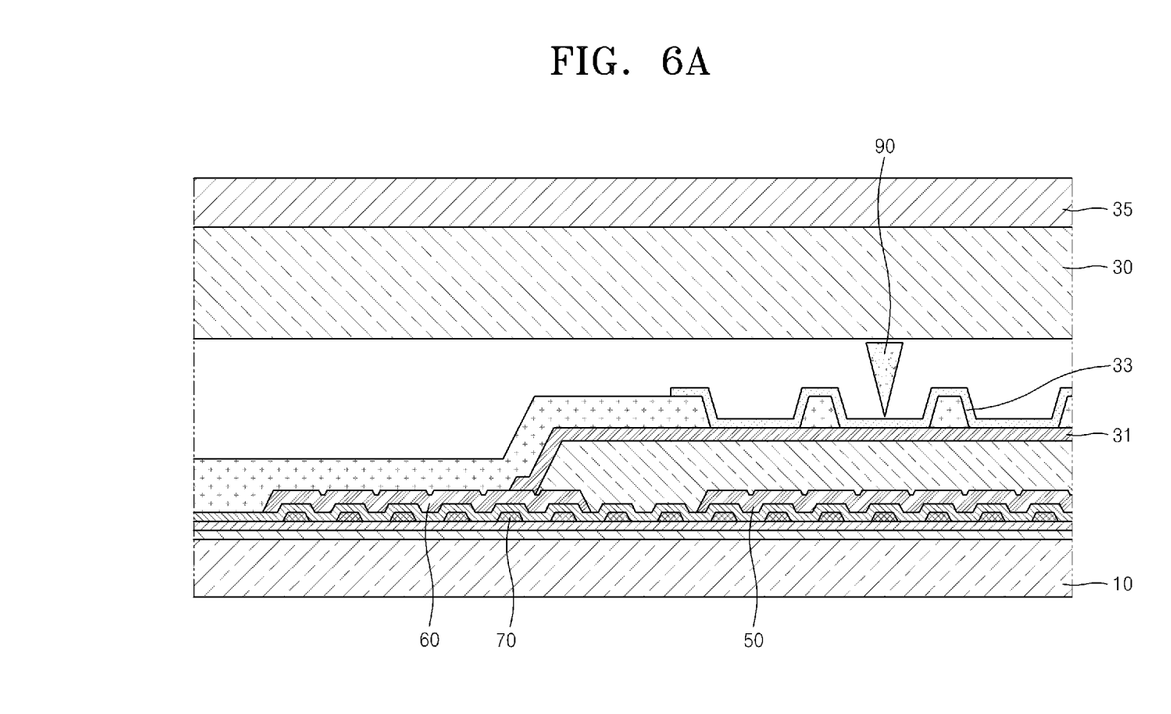
FIGS. 6A and 6B illustrate an organic light-emitting display device including an encapsulation substrate having no cavity in its normal state and in a pressurized state, respectively.

During manufacturing, particles of various sizes may be deposited on surfaces of an unfinished organic light-emitting display device, including those surfaces that will form interior surfaces of the finished organic light-emitting display device. FIG. 6A illustrates an unwanted particle 90 placed on a surface of non-display area of the device. More specifically, the particle 90 is placed on a conductive layer 33 extending from the common electrode 133 of display area of the device and connected to a power line 60 via conductive line 31. Under the conductive layer 33, a power line 50 is passing.

Figure 6B:
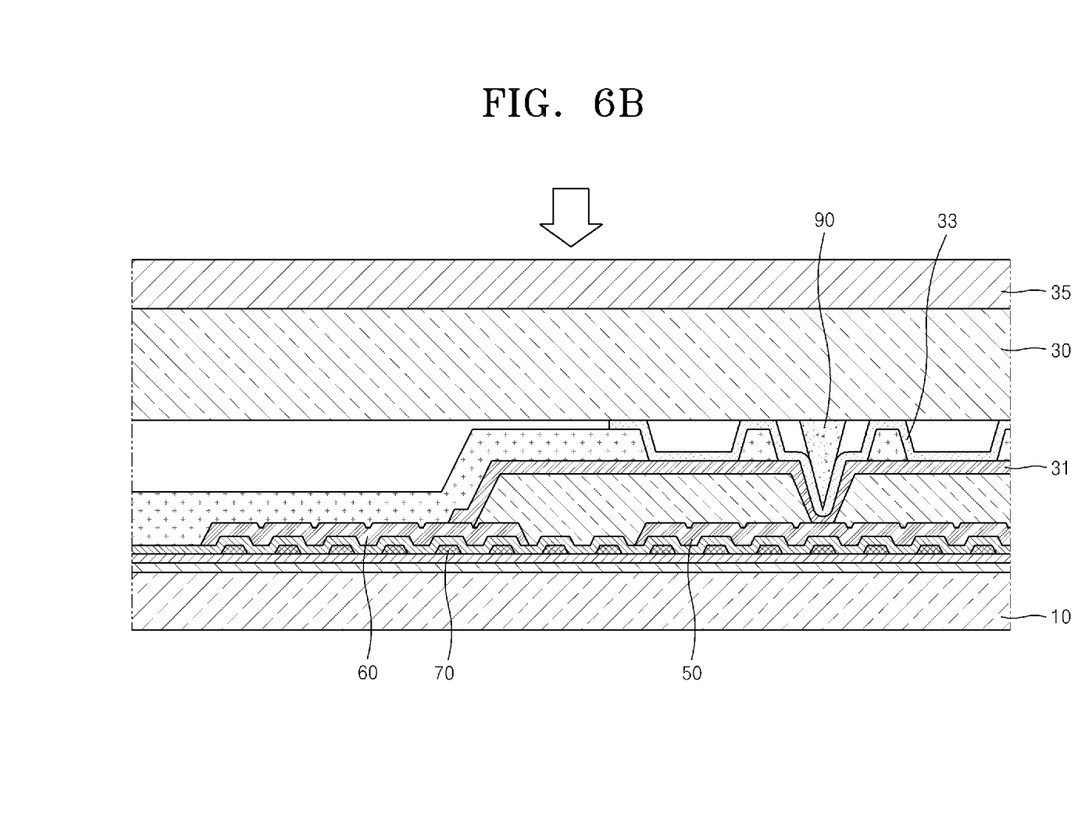

At the encapsulation stage of the manufacturing, the encapsulation substrate 300 is placed over the lower substrate 100, 10 and components formed over the lower substrate 100, 10. The encapsulation substrate 300 and the lower substrate 100, 10 are approached to each other to a desired distance. Then, the encapsulation substrate 300 and the lower substrate 100, 10 are interconnected and sealed with sealing member 200. If the particle 90 is large, the particle may be squashed as the encapsulation substrate 300 moves toward the lower substrate 100, 10. Also, as illustrated in FIG. 6B the particle may be pressed down along with the conductive layer 33 and/or the conductive line 31 to contact the power line 51, which causes a short circuit between the first power supply wiring 150 and the second power supply wiring 160. This can be more likely when the distance between the substrates 100 and 300 is small and the particle size is large. Heat may be generated where the short circuit occurs. This heat may be transferred to the encapsulation substrate 300 and may decolorize the polarizing plate 350 and cause appearance defects.

The encapsulation substrate 300 may press the lower substrate 100 if the organic light emitting display device breaks. In some embodiments, the cavity 320 prevents a short circuit between the first power supply wiring 150 and the second power supply wiring 160 from occurring. In some embodiments, and even when short circuit between the first power supply wiring 150 and the second power supply wiring 160 occurs, the cavity 320 prevents decolorization of the polarizing plate 350.

Figure 4:
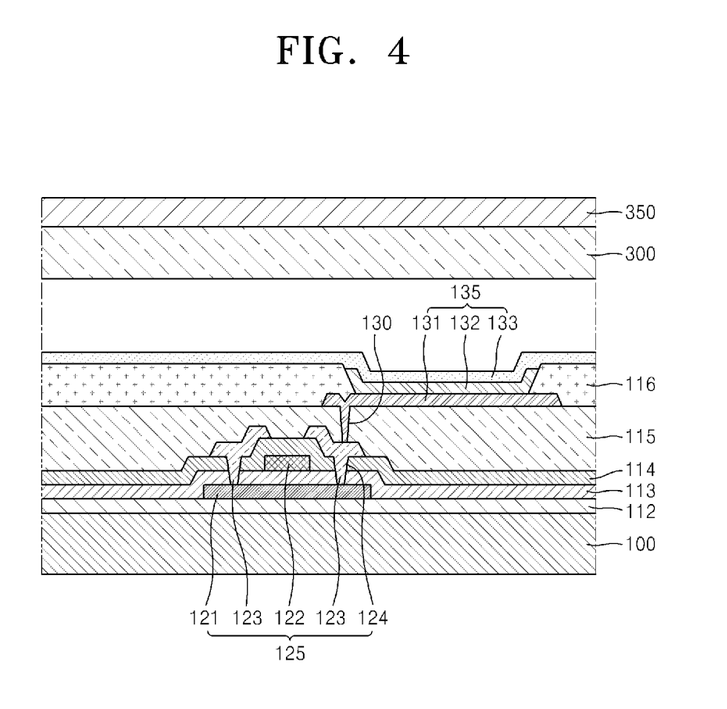
FIG. 4 is a schematic enlarged cross-sectional view of portions of an embodiment of area AA of FIG. 2.

FIG. 4 is a schematic enlarged cross-sectional view of an embodiment of the area AA of FIG. 2.

Referring to FIG. 4, the display unit 120 disposed on the lower substrate 100 may include a plurality of thin film transistors (TFTs) 125 and a plurality of organic light-emitting devices 135. In FIG. 4, for convenience of explanation, one TFT 125 and one organic light-emitting device 135 are illustrated. In some embodiments, the lower substrate 100 may be formed of a transparent glass material containing $SiO_2$ as a main component. In other embodiments, the lower substrate 100 may be formed of various materials, such as for example, a transparent plastic, a metal, or the like.

In some embodiments, the plastic material used to form the lower substrate 100 may be an insulating organic material selected from the group consisting of polyethersulphone (PES), polyacrylate (PAR), polyetherimide (PEI), polyethylene napthalate (PEN), polyethyleneterepthalate (PET), polyphenylene sulfide (PPS), polyallylate, polyimide, polycarbonate (PC), cellulose triacetate (TAC), and cellulose acetate propionate (CAP).

Bottom-emission embodiments of an organic light-emitting display device, which display an image in a direction towards the lower substrate 100, the lower substrate 100 may be formed of a transparent material. In top-emission embodiments of an organic light-emitting display device, which display an image in a direction opposite to the lower substrate 100, the lower substrate 100 may be formed of a metal. The metal may be selected from the group consisting of carbon (C), iron (Fe), chrome (Cr), manganese (Mn), nickel (Ni), titanium (Ti), molybdenum (Mo), stainless steel (SUS), an Invar alloy, an Inconel alloy, and a Kovar alloy. in other embodiments, the lower substrate 100 may be formed of a metal foil.

In some embodiments, an insulating layer 112, such as for example, a barrier layer and/or a buffer layer, may be formed on an upper surface of the lower substrate 100 to prevent diffusion of impurity ions and penetration of moisture or external air and to planarize the upper surface of the lower substrate 100. The insulating layer 112 may be deposited using $SiO_2$ and/or SiNx and the like, by using various deposition methods, such as plasma enhanced chemical vapor deposition (PECVD), atmospheric pressure CVD (APCVD), low pressure CVD (LPCVD), and the like.

The TFT 125 may be disposed on a portion of the insulating layer 112 as a driving circuit.

An active layer 121 of the TFT 125 may be formed of a semiconductor material on the portion of the insulating layer 112. A gate insulating layer 113 may be formed on the insulating layer 112. The active layer 121 may be formed of an inorganic semiconductor material, such as amorphous silicon or polysilicon, or of an organic semiconductor material. The active layer 121 includes a source region, a drain region, and a channel region between the source and drain regions.

The gate insulating layer 113 may be deposited using $SiO_2$ and/or SiNx and the like, by using various deposition methods, such as PECVD, APCVD, LPCVD, and the like. The gate insulating layer 113 may be formed on the entire surface of the lower substrate 100 including the display area AA and the non-display area NA (not shown in FIG. 4).

A gate electrode 122 may be disposed on a portion of the gate insulating layer 113. An interlayer insulating layer 114 may be formed on the gate insulating layer 113. The gate electrode 122 may be formed of various conductive materials, such as aluminum (Al), molybdenum (Mo), tungsten (W), chromium (Cr), nickel (Ni), or a compound thereof. The gate electrode 122 may also be formed of various transparent conductive materials, such as indium tin oxide (ITO), indium zinc oxide (IZO), and the like. When the gate electrode 122 is formed, a data wiring 170 may be simultaneously formed in the non-display area NA (shown in FIG. 5).

The interlayer insulating layer 114 may be formed of a material selected from the group consisting of polyimide, benzocyclobutene series resin, and acrylate, by using spin coating or the like. The interlayer insulating layer 114 may be formed on the entire surface of the lower substrate 100 including the display area AA and the non-display area NA (not shown in FIG. 4).

Source and drain electrodes 123 may be formed on the interlayer insulating layer 114 to connect to the active layer 121 through a contact hole 124. A planarization layer 115 may be formed to cover the source and drain electrodes 123. The source and drain electrodes 123 may be formed of Mg, Al, Ni, Cr, Mo, W, MoW, Au, or the like. The first power supply wiring 150 and the second power supply wiring 160 may be formed of the same material in the non-display area NA (not shown in FIG. 4).

The planarization layer 115 may be formed in the display area AA and the non-display area NA (not shown in FIG. 4). The planarization layer 115 may cover all of the first power supply wiring 150 and portions of the second power supply wiring 160 in the non-display area NA. The planarization layer 115 may be an inorganic insulating layer and/or an organic insulating layer. In embodiments where the planarization layer 115 is an inorganic insulating layer, the inorganic insulating layer may be formed of $SiO_2$, SiNx, SiON, $Al_2O_3$, $TiO_2$, $Ta_2O_{25}$, $HfO_2$, $ZrO_2$, BST, PZT, or the like. In embodiments where the planarization layer 115 is an organic insulating layer, the organic insulating layer may be formed of polymers such as polymethyl-methacrylate (PMMA) or PS, a polymer derivative having a phenol group, acryl-based polymer, imide-based polymer, aryl ether-based polymer, amide-based polymer, fluorine-based polymer, p-xylene-based polymer, vinyl alcohol-based polymer, and a blend thereof. In some embodiments, the planarization layer 115 may be formed in a composite stacked structure of an inorganic insulating layer and an organic insulating layer.

The stacked structure of the TFTs 125 is not limited to the above-described one and various TFT structures may be used in other embodiments. In FIG. 4, top-gate TFTs are illustrated as an example. TFTs having various structures may be used in other embodiments.

A first electrode 131, a pixel electrode of an organic light emitting diode (OLED), may be formed in each of the pixels on the planarization layer 115. The first electrode 131 may be electrically connected to the source and drain electrodes 123 through a via-hole 130. The via-hole 130 may be formed by etching the planarization layer 115 and exposing portions of the source and drain electrodes 123.

A first conductive layer may be deposited on the planarization layer 115 formed in the display area AA and the non-display area NA. In the display area AA, the first conductive layer may be patterned in each of the sub-pixels so as to form the first electrode 131, and the first conductive layer may remain in the non-display area NA without being patterned.

The first electrode 131 may be formed as a transparent electrode or as a reflective electrode. In embodiments where the first electrode 131 is formed as a transparent electrode, the first electrode 131 may be formed of a material selected from the group consisting of indium tin oxide (ITO), indium zinc oxide (IZO), zinc oxide (ZnO), indium oxide ($In_2O_3$) and the like. In embodiments where the first pixel electrode 131 is formed as a reflective electrode, the first electrode 131 may include a reflective layer formed of a material selected from the group consisting of silver (Ag), magnesium (Mg), aluminum (Al), platinum (Pt), palladium (Pd), gold (Au), nickel (Ni), neodymium (Nd), iridium (Ir), chromium (Cr), and a combination thereof, and of a transparent layer that is formed of ITO, IZO, ZnO, In2O3, or the like.

A pixel defining layer (PDL) 116, in which the first electrode 131 is formed, may be disposed above the lower substrate 100. To form the PDL 116, an insulating layer may be deposited on the lower substrate 100. The insulating layer may be patterned to expose portions of the first electrode 131, thereby forming patterns of the PDL 116. Patterning of the PDL 116 may be performed in each of the sub-pixels of the display area AA and in portions of the non-display area NA in which the first power supply wiring 150 is disposed.

The PDL 116 may be formed of one or more organic insulating materials selected from the group consisting of polyimide, polyamide, acryl resin, benzocyclobutene, and phenol resin by using spin coating, or the like. In other embodiments, the PDL 116 may be formed of an inorganic insulating material selected from the group consisting of $SiO_2$, SiNx, $Al_2O_3$, CuOx, $Tb_4O_7$, $Y_2O_3$, $Nb_2O_5$, and $Pr_2O_3$, and one of the above-described organic insulating materials. In other embodiments, the PDL 116 may be formed in a multi-layer structure in which the organic insulating materials and the inorganic insulating materials are alternately deposited.

A second electrode 133 may be disposed above the first electrode 131 to face the first electrode 131. A second conductive layer may be formed on the lower substrate 100 including portions of the display area AA and the non-display area NA. The second conductive layer functions as the second electrode 133 facing the first electrode 131 and an organic layer 132 may be disposed between the first electrode 131 and the second electrode 133 in the display area AA. The second electrode 133 may be connected to all of the sub-pixels.

The second electrode 133 may be formed as a transparent electrode or a reflective electrode. In embodiments where the second electrode 133 is formed as a transparent electrode, the second electrode 133 may include a layer formed of a material selected from the group consisting of lithium (Li), calcium (Ca), lithium fluoride/calcium (LiF/Ca), lithium fluoride/aluminum (LiF/Al), aluminum (Al), silver (Ag), magnesium (Mg), and a combination thereof on the organic layer 132, and an auxiliary electrode or a bus electrode line formed of a transparent conductive material selected from the group consisting of ITO, IZO, ZnO, and $In_2O_3$ on the layer.

In embodiments where the second electrode 133 is formed as a reflective electrode, the second electrode 133 may be formed of a material selected from the group consisting of Ag, Mg, Al, Pt, Pd, Au, Ni, Nd, Ir, Cr, Li, Ca, LiF/Ca, LiF/Al, and a combination thereof.

The organic layer 132 may be formed of a low-molecular weight organic material or of an organic polymer material having a high molecular weight.

In embodiments where the organic layer 132 is formed of a low-molecular weight organic material, the organic layer 132 may have a stacked structure including at least one layer selected from the group consisting of a hole injection layer (HIL), a hole transport layer (HTL), an emission layer (EML), an electron transport layer (ETL), and an electron injection layer (EIL). In some embodiments, the low-molecular weight organic material may include copper phthalocyanine (CuPc), N,N'-Di(naphthalene-1-yl)-N,N'-diphenyl-benzidine (NPB), tris-8-hydroxyquinoline aluminum (Alq3), and the like. The low-molecular weight organic layer may be formed by vacuum deposition using masks.

In embodiments where the organic layer 132 is formed of a high-molecular weight organic material, the organic layer 132 may have a structure including a HTL and EML. In some embodiments, the HTL may be formed of poly(ethylenedioxythiophene) (PEDOT), and the EML may be formed of polyphenylenevinylenes (PPVs) or polyfluorenes.

The encapsulation substrate 300 disposed in the display area AA may have no cavity.

The polarizing plate 350 may be disposed on the encapsulation substrate 300. The polarizing plate 350 may be disposed in a path of light emitted from the display unit 120.

Figure 5:
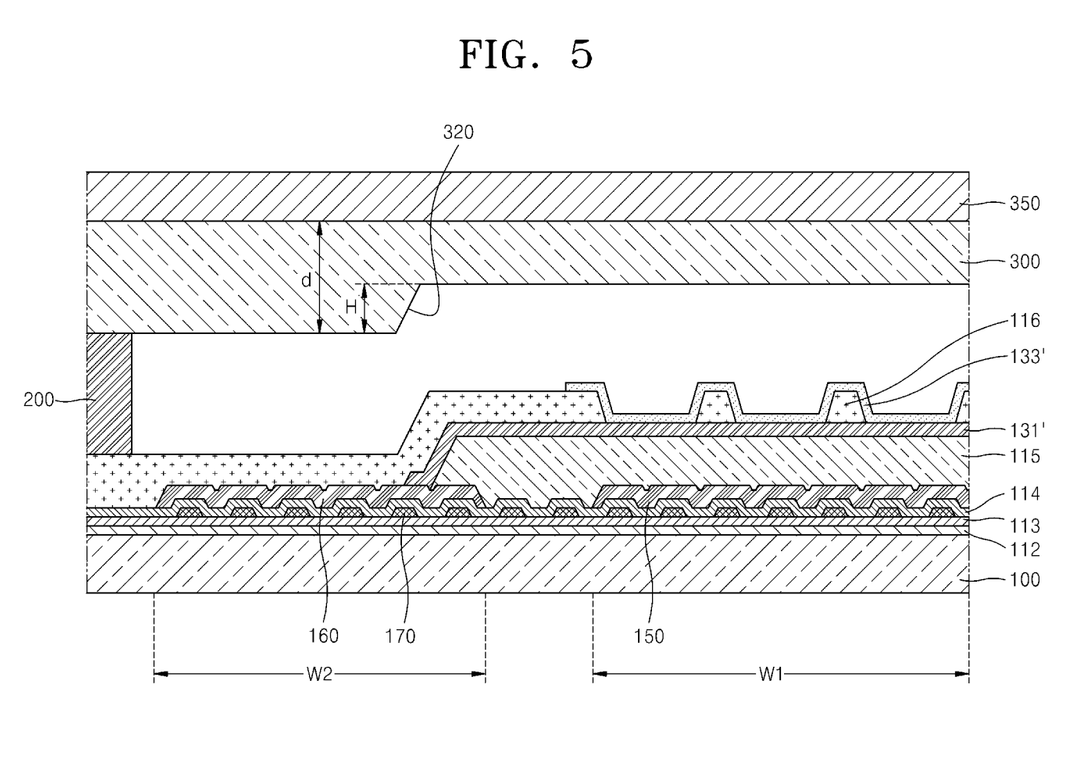
FIG. 5 is a schematic enlarged cross-sectional view of portions of an embodiment of area NA of FIG. 2.

FIG. 5 is a schematic enlarged cross-sectional view of portions of an embodiment of area NA of FIG. 2. Hereinafter, a detailed description of the same elements as those of FIG. 4 will not be repeated.

Referring to FIG. 5, the first power supply wiring 150 and the second power supply wiring 160 may be formed on a surface of the non-display area NA of the lower substrate 100. The cavity 320 may be formed on a surface of the encapsulation substrate 300.

The insulating layer 112, such as a barrier layer and/or a buffer layer, may be formed on the lower substrate 100.

The gate insulating layer 113 may be formed on the insulating layer 112. The gate insulating layer 113 may be formed on the entire surface of the lower substrate 100 so as to include all of the display area AA and the non-display area NA.

The data wiring 170 may be disposed on a top surface of the gate insulating layer 113 and may be connected to a plurality of data lines. In some embodiments, the data wiring 170 may be simultaneously formed with the gate electrode 122 in the display area AA. The data wiring 170 may be formed of the same material as a material used to form the gate electrode 122, such as various conductive materials, such as Al, Mo, W, Cr, Ni or a combination thereof. The data wiring 170 may extend to the driver IC 180 (not shown) disposed outside the sealing element 200.

The interlayer insulating layer 114 may be formed on a top surface of the data wiring 170. The interlayer insulating layer 114 may be formed on the entire surface of the lower substrate 100 so as to include all of the display area AA and the non-display area NA.

The first power supply wiring 150 and the second power supply wiring 160 may be disposed on the top surface of the interlayer insulating layer 114. In the display area AA, the source and drain electrodes 123 may be formed on the same layer in which the first power supply wiring 150 and the second power supply wiring 160 are disposed.

The first power supply wiring 150 is disposed closer to the display unit 120 (not shown) than the second power supply wiring 160. The first power supply wiring 150 may have a width W1. The first power supply wiring 150 may be connected to a source electrode or a drain electrode of the TFTs 125 and may transmit the first power supply voltage VDD to the source electrode or the drain electrode. The first power supply wiring 150 may be formed of the same material as the material used to form the source and drain electrodes 123. In some embodiments, the first power supply wiring 150 may be formed of a material selected from the group consisting of Mg, Al, Ni, Cr, Mo, W, MoW, Au and the like.

The second power supply wiring 160 may be separated from the first power supply wiring 150 by a predetermined distance and may be disposed adjacent to the sealing element 200. The second power supply wiring 160 may have a width W2 that is smaller than the width W1. Portions of the second power supply wiring 160 may contact portions of a first conductive layer 131'. Portions of the first conductive layer 131' may contact a second conductive layer 133'. The second power supply wiring 160 may be electrically connected to the second conductive layer 133' and may transmit the second power supply voltage VSS to the second conductive layer 133'. The second power supply wiring 160 may be formed of the same material as the material used to form the source and drain electrodes 123. In some embodiments, the second power supply wiring 160 may be formed of a material selected from the group consisting of Mg, Al, Ni, Cr, Mo, W, MoW, Au and the like.

The planarization layer 115 may be disposed above the lower substrate 100 and the first power supply wiring 150. In the embodiment of FIG. 5, the planarization layer 115 is formed to cover all of the first power supply wiring 150 and portions of the second power supply wiring 160.

The first conductive layer 131' may be formed on the planarization layer 115. The first conductive layer 131' may be deposited on the lower substrate 100 and patterned into the first electrode 131 in the display area AA. The first conductive layer 131' may remain in the non-display area NA without being patterned. The first conductive layer 131' may be formed of a material selected from the group consisting of ITO, IZO, ZnO, $In_2O_3$ and the like. The first conductive layer 131' may include a reflective layer formed of a material selected from the group consisting of Ag, Mg, Al, Pt, Pd, Au, Ni, Nd, Ir, Cr, and a combination thereof, and a transparent layer that is formed of a material selected from the group consisting of ITO, IZO, ZnO, and $In_2O_3$.

The PDL 116, in which the first conductive layer 131' is formed, may be formed above the lower substrate 100. The PDL 116 may be formed by patterning an insulating layer deposited on the entire surface of the lower substrate 100. The PDL 116 may expose portions of the first electrode 131 in each of the sub-pixels in the display area AA. The PDL 116 may expose portions of the first conductive layer 131' in the non-display area NA by the predetermined distance.

The second conductive layer 133' may be formed to cover the PDL 116 and the exposed first conductive layer 131'. The second conductive layer 133' may function as the second electrode 133 that is connected to all of the sub-pixels. The second conductive layer 133' may contact the first conductive layer 131' exposed by the PDL 116. The second conductive layer 133' may be formed by depositing a material selected from the group consisting of Ag, Mg, Al, Pt, Pd, Au, Ni, Nd, Ir, Cr, Li, Ca, LiF/Ca, LiF/Al, and a combination thereof, to a small thickness. The second conductive layer 133' may include a layer that is formed of a material selected from the group consisting of Li, Ca, LiF/Ca, LiF/Al, Al, Mg, and a combination thereof, and a layer that is formed of a transparent conductive material selected from the group consisting of ITO, IZO, ZnO, and $In_2O_3$.

The second conductive layer 133' may contact the first conductive layer 131' in the non-display area NA and may be electrically connected to the second power supply wiring 160 via the first conductive layer 131'.

The lower substrate 100 may be bonded to the encapsulation substrate 300. The encapsulation substrate 300 may be any substrate formed of various materials. In some embodiments, the encapsulation substrate 300 may be a glass substrate, a plastic substrate, or a metal plate. The encapsulation substrate 300 includes the cavity 320 formed in a region corresponding to at least the first power supply wiring 150.

The polarizing plate 350 is disposed on the encapsulation substrate 300.

The lower substrate 100 and the encapsulation substrate 300 may be bonded together with the sealing element 200. In some embodiments, a glass frit may be used as the sealing element 200.

FIGS. 6A and 6B illustrate an organic light-emitting display device including an encapsulation substrate having no cavity in its normal state and in a pressurized state, respectively.

Referring to FIG. 6A, particles 90 may be generated in an organic light-emitting display device during manufacturing. With the organic light-emitting display device in its normal state, a short circuit between a first power supply wiring 50 and a second power supply wiring 60 does not generally occur.

Referring to FIG. 6B, where the size of the particles 90 is relatively large, for example, when the size of the particles 90 is larger than a height from the first power supply wiring 50 to a second conductive layer 33, the second conductive layer 33 and the first conductive layer 31 that contacts the second conductive layer 33 may contact the first power supply wiring 50 due to the pressurized encapsulation substrate 30. Thus, a short circuit between the first power supply wiring 50 and the second power supply wiring 60 may occur. Heat may be generated where the short circuit occurs. The transferal of this heat to the encapsulation substrate 30 may cause decolorization of the polarizing plate 35, in turn causing appearance defects.

Pressurization of the lower substrate 10 may occur when the organic light-emitting display device breaks and the encapsulation substrate 30 pressurizes the lower substrate 10. A short circuit between the first power supply wiring 50 and the second power supply wiring 60 may occur in such cases.

Referring back to FIG. 5, with a cavity 320 formed in a region corresponding to the power supply wiring units 150 and 160, a short circuit between the first power supply wiring 150 and the second power supply wiring 160 may be prevented. The cavity 320 may prevent the short circuit between the first power supply wiring 150 and the second power supply wiring 160 when the encapsulation substrate 300 is pressurized due to a break or due to the presence of particles. Also, even when the short circuit between the first power supply wiring 150 and the second power supply wiring 160 occurs, the cavity 320 may remove portions that directly contact the lower substrate 100 from the encapsulation substrate 300, thereby preventing decolorization of the polarization plate 350.

The cavity 320 may have a width corresponding to at least the width W1 of the first power supply wiring 150. In some embodiments, the width of the cavity 320 may correspond to the sum of the width W1 of the first power supply wiring 150 and the width W2 of the second power supply wiring 160. The cavity 320 may have a height H of about d/2, where d represents the thickness of the encapsulation substrate 300. With the height H of the cavity 320 less than d/2, the cavity 320 remains flexible. With the cavity 320, a short circuit between the first power supply wiring 150 and the second power supply wiring 160 due to particles having a height greater than a height from the first power supply wiring 150 to the second conductive layer 133' may be prevented.

Although certain embodiments are described above with reference to active matrix light-emitting display devices, the embodiments may be applied to any of various display devices, including passive matrix organic light-emitting display devices, liquid crystal display devices, and the like.

In embodiments of an organic light-emitting display device, a short circuit between power supply wirings in a non-display area may be prevented such that decolorization of a polarizing plate and appearance defects may be prevented.

While embodiments have been particularly shown and described, it will be understood by those of ordinary skill in the art that various changes in form and details may be made therein without departing from the spirit and scope of the present invention as defined by the following claims.

What is claimed is:

1. An organic light-emitting display device comprising:
   a lower substrate comprising a display area and a non-display area, the lower substrate further comprising a power supply wiring unit disposed in the non-display area, the power supply wiring unit comprising at least one power supply wiring extending along an edge of the display area;
   an encapsulation substrate having an outer surface and an inner surface facing the lower substrate, wherein the encapsulation substrate is disposed over the entire lower substrate;
   a cavity formed into the inner surface of the encapsulation substrate in a region over the power supply wiring unit such that the encapsulation substrate is spaced further apart from at least part of the power supply wiring than from the display area, when viewed in a direction perpendicular to the outer surface of the encapsulation substrate; and
   a polarizing plate disposed on the outer surface of the encapsulation substrate.

2. The organic light-emitting display device of claim 1, wherein the at least one power supply wiring comprises:
   a first power supply wiring is configured to transmit a first power supply voltage; and
   a second power supply wiring is configured to transmit a second power supply voltage.

3. The organic light-emitting display device of claim 2, wherein the first power supply wiring is disposed closer to the display area than the second power supply wiring.

4. The organic light-emitting display device of claim 2, wherein the cavity is formed in a region over the first power supply wiring.

5. The organic light-emitting display device of claim 2, wherein a plurality of thin film transistors (TFTs) are disposed on the display area, and
   wherein each of the TFTs comprises:
      an active layer;

a gate electrode disposed on a gate insulating layer, wherein the gate insulating layer covers the active layer and extends to the non-display area; and source and drain electrodes disposed on an interlayer insulating layer, wherein the interlayer insulating layer covers the gate electrode and extends to the non-display area, and the source and drain electrodes contact the active layer through a contact hole formed in the gate insulating layer and the interlayer insulating layer, and wherein the lower substrate comprises an extension of the interlayer insulating layer from the display area, wherein the first power supply wiring and the second power supply wiring are separated from each other on the extension of the interlayer insulating layer.

6. The organic light-emitting display device of claim 5, wherein the first power supply wiring and the second power supply wiring comprise the same material as the material used to form the source and drain electrodes.

7. The organic light-emitting display device of claim 5, further comprising:
a planarization layer covering the source and drain electrodes and extending into the non-display area;
a first conductive layer patterned on the planarization layer in the display area in each of sub-pixels and disposed on the planarization layer of the non-display area;
a pixel defining layer covering the planarization layer and exposing portions of the first conductive layer; and
a second conductive layer disposed on the first conductive layer and contacting the first conductive layer in the non-display area.

8. The organic light-emitting display device of claim 7, wherein at least a portion of the second power supply wiring contacts at least a portion of the first conductive layer.

9. The organic light-emitting display device of claim 1, wherein a height of the cavity is equal to or less than a half of a height of the encapsulation substrate.

10. The organic light-emitting display device of claim 1, further comprising a sealing element surrounding the display area and the power supply wiring unit and bonding the lower substrate and the encapsulation substrate together.

11. A method of manufacturing the organic light-emitting display device of claim 1, the method comprising:
providing the lower substrate comprising the display area and the non-display area outside of the display area, the lower substrate further comprising the power supply wiring unit disposed in the non-display area, the power supply wiring unit comprising at least one power supply wiring extending along the edge of the display area;
providing the encapsulation substrate having the inner surface and the outer surface, wherein the inner surface faces the lower substrate, wherein the polarization plate is provided on the outer surface, wherein a cavity is formed into the inner surface in the region over the power supply wiring unit such that the encapsulation substrate is spaced further apart from at least part of the power supply wiring than from the display area, when viewed in a direction perpendicular to the outer surface of the encapsulation substrate; and
aligning and bonding the lower substrate and the encapsulation substrate.

12. The method of claim 11, wherein the at least one power supply wiring comprises:
a first power supply wiring is configured to transmit a first power supply voltage; and
a second power supply wiring is configured to transmit a second power supply voltage.

13. The method of claim 12, wherein the first power supply wiring is disposed closer to the display area than the second power supply wiring.

14. The method of claim 12, wherein the cavity is formed in a region over the first power supply wiring.

15. The method of claim 12, wherein a plurality of thin film transistors (TFTs) are disposed in the display area, and
wherein each of the TFTs comprises:
an active layer;
a gate electrode disposed on a gate insulating layer, wherein the gate insulating layer covers the active layer and extends to the non-display area; and
source and drain electrodes disposed on an interlayer insulating layer, wherein the interlayer insulating layer covers the gate electrode and extends to the non-display area, and the source and drain electrodes contact the active layer through a contact hole formed in the gate insulating layer and the interlayer insulating layer, and
wherein the lower substrate comprises an extension of the interlayer insulating layer from the display area, wherein the first power supply wiring and the second power supply wiring are separated from each other on the extension of the interlayer insulating layer.

16. The method of claim 15, wherein the first power supply wiring and the second power supply wiring comprise the same material as the material used to form the source and drain electrodes.

17. The method of claim 15, further comprising:
providing a planarization layer covering the source and drain electrodes and extending into the non-display area;
providing a first conductive layer patterned on the planarization layer in the display area in each of sub-pixels and disposed on the planarization layer of the non-display area;
providing a pixel defining layer covering the planarization layer and exposing portions of the first conductive layer; and
providing a second conductive layer disposed on the first conductive layer contacting the first conductive layer in the non-display area.

18. The method of claim 17, wherein at least a portion of the second power supply wiring contact at least a portion of the first conductive layer.

19. The method of claim 11, wherein a height of the cavity is equal to or less than a half of a height of the encapsulation substrate.

20. The method of claim 12, further comprising forming a sealing element that surrounds the display area and the power supply wiring unit and bonds the lower substrate and the encapsulation substrate together.

21. An organic light-emitting display device comprising:
a lower substrate comprising a display area and a non-display area, the lower substrate further comprising a power supply wiring unit disposed in the non-display area, the power supply wiring unit comprising at least one power supply wiring extending along an edge of the display area;
an encapsulation substrate having an outer surface and an inner surface facing the lower substrate;
a cavity formed into the inner surface of the encapsulation substrate in a region over the power supply wiring unit such that the cavity overlaps at least part of the power supply wiring when viewed in a direction perpendicular to the outer surface of the encapsulation substrate; and
a polarizing plate disposed on the outer surface of the encapsulation substrate, wherein a plurality of thin film transistors (TFTs) are disposed on the display area, wherein each of the TFTs comprises:
an active layer;
a gate electrode disposed on a gate insulating layer, wherein the gate insulating layer covers the active layer and extends to the non-display area; and
source and drain electrodes disposed on an interlayer insulating layer, wherein the interlayer insulating layer covers the gate electrode and extends to the non-display area, and the source and drain electrodes contact the active layer through a contact hole formed in the gate insulating layer and the interlayer insulating layer, and
wherein the lower substrate comprises an extension of the interlayer insulating layer from the display area, wherein the first power supply wiring and the second power supply wiring are separated from each other on the extension of the interlayer insulating layer.

22. The organic light-emitting display device of claim 21, wherein the first power supply wiring and the second power supply wiring comprise the same material as the material used to form the source and drain electrodes.

23. The organic light-emitting display device of claim 21, further comprising:
a planarization layer covering the source and drain electrodes and extending into the non-display area;
a first conductive layer patterned on the planarization layer in the display area in each of sub-pixels and disposed on the planarization layer of the non-display area;
a pixel defining layer covering the planarization layer and exposing portions of the first conductive layer; and
a second conductive layer disposed on the first conductive layer and contacting the first conductive layer in the non-display area.

24. The organic light-emitting display device of claim 23, wherein at least a portion of the second power supply wiring contacts at least a portion of the first conductive layer.

* * * * *